United States Patent [19]
Weinberger

[11] 3,975,623
[45] Aug. 17, 1976

[54] LOGIC ARRAY WITH MULTIPLE READOUT TABLES

[75] Inventor: Arnold Weinberger, Poughkeepsie, N.Y.

[73] Assignee: IBM Corporation, Armonk, N.Y.

[22] Filed: Dec. 30, 1974

[21] Appl. No.: 537,217

[52] U.S. Cl. ............................. 235/152; 307/207; 328/92
[51] Int. Cl.² ........................................ H03K 19/20
[58] Field of Search ............... 235/152; 340/173 FF, 340/173 AM, 166 R; 328/92; 307/207

[56] References Cited
UNITED STATES PATENTS

| | | | |
|---|---|---|---|
| 3,699,534 | 10/1972 | Kautz | 340/172.5 |
| 3,761,902 | 9/1973 | Weinberger | 340/173 FF |
| 3,816,725 | 6/1974 | Greer | 235/152 |
| 3,818,452 | 6/1974 | Greer | 340/166 R |
| 3,849,638 | 11/1974 | Greer | 235/152 |

*Primary Examiner*—David H. Malzahn
*Attorney, Agent, or Firm*—James E. Murray

[57] ABSTRACT

This specification describes a programmable logic array (PLA) in which the readout table or OR array for the PLA is broken into two segments and the segments placed on opposite sides of the search table or AND array for the PLA. The output lines for the AND array can then be split so that outputs on one segment of those lines are fed to the OR array on one side and outputs on the other portion of those lines are fed to the OR array on the opposite side. Likewise the output lines in the OR arrays can be broken so that different functions can be fed out to opposite sides of the OR arrays. It is also possible to break input lines in both the OR and AND arrays to isolate functions from one another.

6 Claims, 3 Drawing Figures

| A·B | A·B̄ | Ā·B | Ā·B̄ | PRODUCT TERM FUNCTION FORMED |
|---|---|---|---|---|
| 0 | 0 | 0 | 0 | DON'T CARE |
| 0 | 0 | 0 | 1 | A + B |
| 0 | 0 | 1 | 0 | A + B̄ |
| 0 | 0 | 1 | 1 | A |
| 0 | 1 | 0 | 0 | Ā + B |
| 0 | 1 | 0 | 1 | B |
| 0 | 1 | 1 | 0 | A = B |
| 0 | 1 | 1 | 1 | A · B |
| 1 | 0 | 0 | 0 | Ā + B̄ |
| 1 | 0 | 0 | 1 | A ≠ B |
| 1 | 0 | 1 | 0 | B̄ |
| 1 | 0 | 1 | 1 | A · B̄ |
| 1 | 1 | 0 | 0 | Ā |
| 1 | 1 | 0 | 1 | Ā · B |
| 1 | 1 | 1 | 0 | Ā · B̄ |
| 1 | 1 | 1 | 1 | FALSE ← NEVER USED |

LOGIC ARRAY WITH MULTIPLE READOUT TABLES

BACKGROUND OF THE INVENTION

The present invention relates to arrays for performing logic functions and more particularly it is related to increasing the number of logic functions performed in an array without increasing the size of the array.

The performing of logic in matrices of identical circuit elements each located at a unique intersection of an input and output line in a grid of intersecting input and output lines is well known. It is also well known that the standardization of logic circuit layouts stemming from the use of logic matrices or arrays results in the simplification and acceleration of the design and manufacturing of monolithic chips containing logic performing circuits. However, up until now the use of the logic arrays has been limited. A major cause in this limited use has been that only a small percentage of the intersections in an array turn out to be usable in performing logic functions. This percentage of useful intersections in the arrays results in inefficient use of the surface area of the monolithic chips on which the arrays are fabricated. It turns out, that for most applications, the design and manufacturing efficiencies of logic arrays are outweighed economically by their inefficient use of chip area and it is less expensive to spend additional time and effort to design and manufacture logic chips with highly customized layouts that are less orderly than logic arrays but perform far more logic functions in a given area of a monolithic chip.

The small percentage of usable logic circuits in a logic array is a result of the orderliness of the array. Once input and output lines are used to perform a given logic function they cannot be used in performing other unrelated logic functions without hopelessly garbling the logic. As a result large areas of the array contain intersections of input and output lines that are barren of usable circuits.

A number of schemes have been devised to reduce the sparceness of the logic on logic array chips. One such scheme is to use a plurality of decoders to feed input variables to the input lines of a single array allowing a number of very powerful logic functions to be efficiently performed in a single array. Another scheme used to reduce sparseness involves using compound arrangements of arrays called programmable array logic chips (PLAs). These involve feeding the output of a first array called a product term generator, a search table or an AND array, to a second array called the sum of a product term generator, a readout table or an OR array, so as to increase the number of functions that can be performed without geometrically increasing the number of array intersections needed to perform those functions. While these modifications increase the number of useful logic circuits that can be placed in an array logic chip, they do not solve the problem of the unusable portions of the input and output lines that is discussed above.

THE INVENTION

In accordance with the present invention, use is made of heretofor unusable portions of the input and output lines of both the AND and OR arrays in the PLA chips by breaking the readout table or OR array for the PLA into two segments and placing the segments on opposite sides of the search table or AND array for the PLA. The output lines for the AND array can then be split so that outputs on one segment of those lines are fed to the OR array on one side and outputs on the other portion of those lines are fed to the OR array on the opposite side. Likewise the output lines in the OR arrays can be broken so that different functions can be fed out to opposite sides of the OR arrays. It is also possible to break input lines in both the OR and AND arrays to isolate functions from one another.

As can be seen, the output and input lines of the arrays can now be used to carry two segments instead of one thus reducing the number of unused intersections of input and output lines in the arrays.

It is an object of the present invention to increase the amount of logic that can be performed by a logic array circuit chip of a given size.

Another object of the present invention is to reduce the size of segments of the array that cannot be used to perform usable logic functions.

A further object of the invention is to provide array logic in which intersections arranged along input and output lines so they are used to perform one function and can be used to perform another function.

THE DRAWINGS

DETAILED DESCRIPTION

Figure 1:
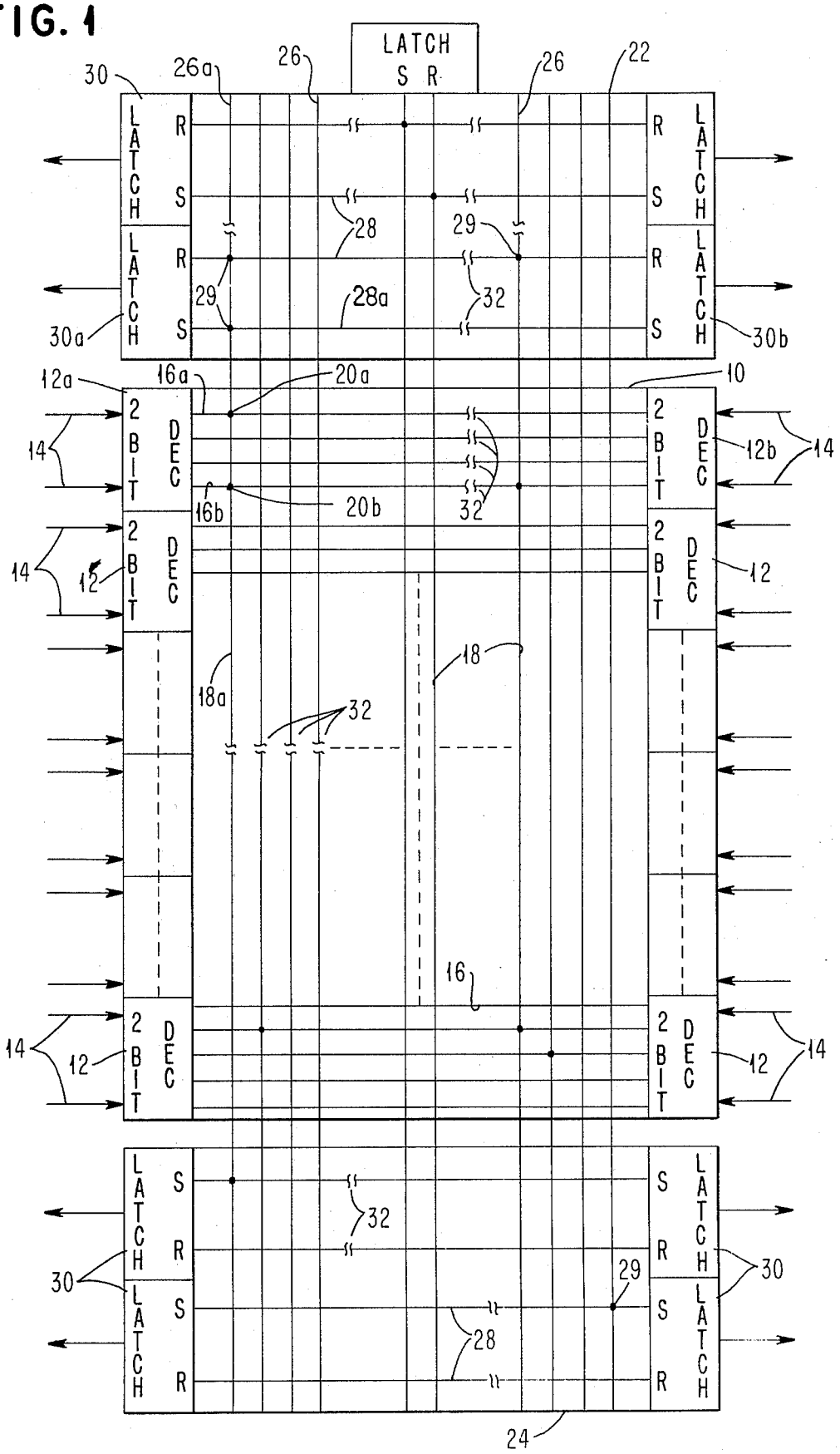
FIG. 1 is a schematic representation of a layout for a PLA incorporating the present invention.

Referring now to FIG. 1, the inputs to an AND array 10 are connected to a plurality of two bit input decoders 12 located on both sides of the AND array. These decoders 12 provide four output combinations of two input variables. The decoders 12 receive input variables on input lines 14 and feed each one of its four output combinations of two variables to a different input line 16 in the array 10.

Arranged orthogonally with respect to the input lines 16 are a plurality of parallel output lines 18 that form a grid with the input lines. Located at intersections of certain of the input and output lines 16 and 18 are logic performing devices 20 that will perform a logical operation, in this case an AND operation, on data placed on the input lines 16 and provide the resultant on the output lines 18.

The output lines 18 of the AND array 10 are connected to the input lines 26 for two OR arrays 22 and 24 positioned on opposite sides of the AND array. These input lines 26 intersect the output lines 28 of the OR array. Located at certain of these intersections are logic producing elements 29 that perform an OR function with respect to the signals received from the AND arrays and provide the resultant on the output lines 28.

Figures 2, 3:
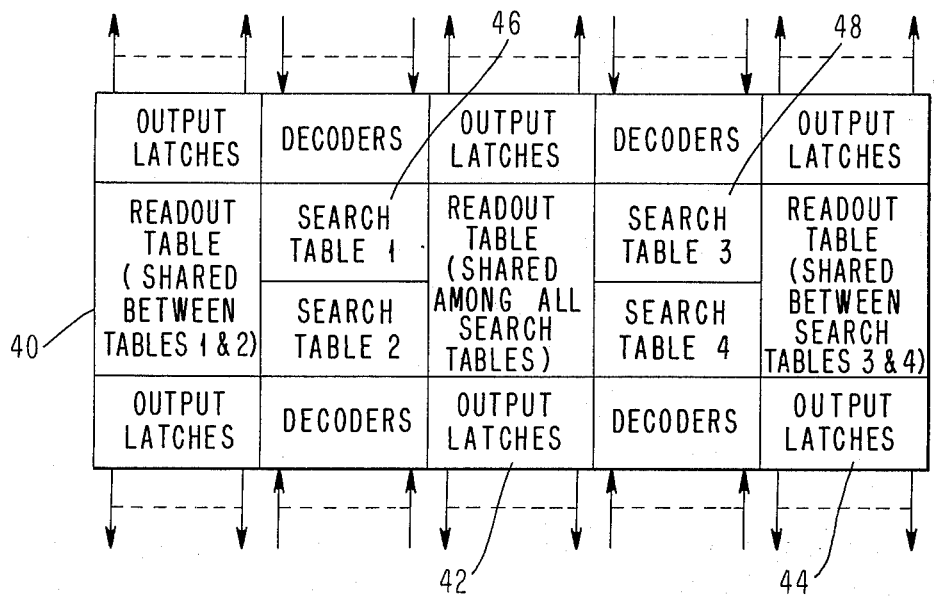
FIG. 2 is a chart of the logic functions that can be performed on any two input variables in the PLA of FIG. 1.
FIG. 3 is schematic representation of an alternative layout for a PLA incorporating the present invention.

As can be seen, logical functions can be performed on the inputs to the two bit decoders in the two bit decoders 12, the AND array 10, the OR arrays 22 and 24 and the JK latches 30. The different logical functions that can be performed in the decoders 12 and the AND array 10 on any two inputs $a$ and $b$ to one of the decoders 12$a$ is shown in FIG. 2. Each column in the chart of FIG. 2 represents one of the four input lines 16 connected to an output of the decoder 12$a$. The headings on any column of this chart is the function performed by the decoder 12a on the inputs a and b in placing an interrogation signal on the input line 16 represented by that column. The rows of the chart represent output lines of the array. The legend on each row indicates the logical function that will be placed on the output line 18 represented by that row when the input lines of the array, marked by a binary "1" in their columns along that row, are ANDed together by coupling those input lines to that output line 18 with logic performing elements 20. For instance the Exclusive OR function of a and b is placed on output line 18 when input lines 16a and 16b are connected to it by the logic elements 20a and 20b. Performing logic operations using arrays and two bit decoders in this manner is well known and can be found in Weinberger's U.S. Pat. No. 3,761,902, dated Sept. 25, 1973.

In accordance with the present invention functions are more densely arranged on PLA chips. This is accomplished by dividing the readout table of the PLA into two separate OR arrays, and segmenting both the input and output lines of the arrays to separate the functions performed in the arrays from one to another. For instance, the Exclusive OR function mentioned previously is placed into OR array 22 using input lines 16a and 16b and output line 18a of the AND array 10. These lines can be segmented in the array by providing an opening 32 in the lines. Thus the remainder of the input lines 16a and 16b can be used in performing functions on inputs supplied to decoder 12b also coupled to those lines while the remainder of the output line 18a can be used in performing functions on inputs to other decoders and those functions fed into OR array 24. Not all the input and output lines need be broken. One decoder can use all the intersections along the four input lines to perform logic functions. Likewise the functions placed on any of the output lines of the AND array can be fed to both OR arrays 22 and 24 by maintaining that output line whole. Like the lines in the OR array, OR arrays 22 and 24 are also broken to separate functions. Latch 30a is used in transferring the Exclusive OR function generated on line 18a off the chip. The input line 24a and output line 26a of the OR array 22 used to do this can be segmented to permit their use to perform other functions. The unused portion of the output line can be used in connection with latch 30b. In fact output lines of the OR arrays can be divided into three or more segments and the inside segments used with latches or other circuits placed at the ends of the OR arrays. The use for the rest of the input line 24a is not clear from FIG. 1 but will be when it is discussed in connection with the embodiment shown in FIG. 3.

As can be seen, with this arrangement both input and output lines in both arrays can be used to perform two individual logical functions without a mixing of those functions because the openings 32 in the lines keep the functions isolated one from the other.

It is not necessary that the lines be broken and as pointed out before, full lines can be used when the function to be performed demands it. Thus the arrangement adds significant flexibility to performing logic in arrays. This flexibility enables more functions to be performed in an array of a given size and still permits functions requiring a large number of intersections to be performed in the array.

Other arrangements of the arrays can be employed with this invention. For instance, the arrangement described herein can be combined with the arrangement shown in U.S. patent application Ser. No. 537,219 filed Dec. 30, 1974, filed on even date herewith in the name of Dennis T. Cox et al. and entitled "High Density Logic Array" to come up with the string of arrays shown in FIG. 3 where there are three readout tables 40, 42, and 44 that are shared by two search tables 46 and 48. The input lines of the interior readout table 42 would receive output signals of both search arrays 46 and 48 while the outboard readout tables would receive signals respectively from only search table 46 or 48.

As can be seen segmenting the input lines of the central OR table now enables the use of those input lines for two separate signals; one from search table 46 and one from search table 48. The dividing procedure can be further extended by dividing the search tables 46 and 48 into two portions each so that all the lines in the AND array are broken and so that in effect there are four search and three readout tables in the configuration shown herein. It should be understood that output lines in the readout tables are also broken as described above.

The arrays can be fabricated on monolithic chips and personalized in many ways including those described in the above mentioned co-pending application. Therefore while the invention has been particularly shown and described with reference to a preferred embodiment thereof, it will be understood by those skilled in the art that the above and other changes in form and details may be made therein without departing from the spirit and scope of the invention.

What is claimed is:

1. In a programmable logic array chip having a search table of intersecting input and output lines with logic elements coupling input lines to output lines at these intersections for receiving interrogation signals on said input lines from a plurality of decoders and a readout table with intersecting input and output lines having logic elements coupling input lines to output lines at there intersections and which has the input lines coupled to the output lines of the search table to receive the output signals from the search table in response to the interrogations and which in turn supplies output signals responsive to the interrogation signals, the improvement comprising:

said readout table divided into two portions with input lines of one portion of the readout table receiving output signals from one end of output lines of the search table and with input lines of the other portion of the readout table receiving outputs from the other end of the output lines of the search table; and segmented output lines in the search table so that the output signals fed from opposite ends of the segmented lines are not mixed on the segmented lines.

2. The programmable logic array chip of claim 1 including:

latch means coupled to opposite ends of output lines in both portions of said readout table; and segmented output lines in the readout table to isolate signals fed to the latch connected to one segment from the signal fed to the latch connected to the other segment.

3. The programmable logic array chip of claim 2 including:

decoders connected to opposite ends of input lines in the search table; and segmented input lines in the search table to isolate interrogation signals from the decoder coupled to one segment from the interrogation signals from the decoder coupled to the other segment.

4. In a programmable logic array chip having a search table of intersecting input and output lines with logic elements coupling input lines to output lines at their intersections for receiving interrogation signals on said input lines from a plurality of decoders and a read table with intersecting input and output lines with logic elements coupling input lines to output lines at their intersection and which has the input lines coupled to output lines of the search table to receive the output signals from the search table in response to the interrogations and which in turn supplies output signals responsive to the interrogation signals, the improvement comprising:

three readout tables and two search tables with one readout table positioned between and adjacent to one side of the two search tables and the other two readout tables each positioned adjacent the opposite side of a different one of the two search tables and with the output lines of each search table coupled to the input lines of the two readout tables adjacent to that search table so that said one readout table receives the outputs of both the search tables while the other two receive the outputs of only one search table.

5. The programmable logic array chip of claim 4 including, segmented input lines in said one readout table so that the output signals received from one of the search tables on a segment is isolated from output signals received from the other of the search tables on the other segment of the same line.

6. The programmable logic array chip of claim 5 including, segmented output lines in the search tables so that output signals fed from opposite ends of the same lines are not mixed on the segmented line.

* * * * *